(12) United States Patent
Hopkins

(10) Patent No.: US 11,121,145 B1
(45) Date of Patent: Sep. 14, 2021

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, inc., Boise, ID (US)

(72) Inventor: John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/807,523

(22) Filed: Mar. 3, 2020

(51) Int. Cl.
| | |
|---|---|
| *G11C 11/34* | (2006.01) |
| *G11C 16/04* | (2006.01) |
| *H01L 27/11556* | (2017.01) |
| *G11C 5/06* | (2006.01) |
| *H01L 21/768* | (2006.01) |
| *H01L 27/11582* | (2017.01) |
| *G11C 5/02* | (2006.01) |

(52) U.S. Cl.
CPC ........ *H01L 27/11556* (2013.01); *G11C 5/025* (2013.01); *G11C 5/06* (2013.01); *H01L 21/76838* (2013.01); *H01L 27/11582* (2013.01)

(58) Field of Classification Search
CPC ......... H01L 27/11556; H01L 27/11582; H01L 21/76838; G11C 5/025; G11C 5/06
See application file for complete search history.

(56) References Cited

U.S. PATENT DOCUMENTS 9,431,419 B2 8/2016 Fukuzumi et al.
9,741,737 B1 8/2017 Huang et al.
(Continued)

FOREIGN PATENT DOCUMENTS

CN 102760738 10/2012
KR 10-2016-0018921 2/2016
(Continued)

OTHER PUBLICATIONS

U.S. Appl. No. 16/194,926, filed Nov. 19, 2018, by Chandolu et al.
(Continued)

*Primary Examiner* — Toan K Le
(74) *Attorney, Agent, or Firm* — Wells St. John P.S.

(57) ABSTRACT

A memory array comprising strings of memory cells comprises a conductor tier comprising conductor material. The memory array comprises laterally-spaced memory blocks individually comprising a vertical stack comprising alternating insulative tiers and conductive tiers directly above the conductor tier. Conducting material of a lowest of the conductive tiers is directly against the conductor material of the conductor tier. Channel-material strings of memory cells extend through the insulative tiers and the conductive tiers. Intervening material is laterally-between and longitudinally-along immediately-laterally-adjacent of the memory blocks. The conducting material in the lowest conductive tier is directly against the channel material of individual of the channel-material strings. Conductive material is of different composition from that of the conducting material above and directly against the conducting material. Other embodiments, including method, are disclosed.

19 Claims, 12 Drawing Sheets

(56) References Cited

U.S. PATENT DOCUMENTS

| | | |
|---|---|---|
| 9,978,772 B1 | 5/2018 | Carlson |
| 10,236,301 B1 | 3/2019 | Howder et al. |
| 2009/0166710 A1 | 7/2009 | Shimizu et al. |
| 2010/0109072 A1 | 5/2010 | Kidoh et al. |
| 2012/0273865 A1 | 11/2012 | Lee et al. |
| 2015/0017770 A1 | 1/2015 | Lee et al. |
| 2015/0318301 A1* | 11/2015 | Lee .................. H01L 27/11582 257/324 |
| 2016/0043100 A1 | 2/2016 | Lee et al. |
| 2016/0111435 A1 | 4/2016 | Pang et al. |
| 2016/0163389 A1 | 6/2016 | Zhang et al. |
| 2016/0163729 A1 | 6/2016 | Zhang et al. |
| 2016/0172370 A1 | 6/2016 | Makala et al. |
| 2016/0204117 A1* | 7/2016 | Liu .................. H01L 27/11551 257/324 |
| 2016/0225754 A1 | 8/2016 | Jang |
| 2016/0233230 A1 | 8/2016 | Furuhashi et al. |
| 2016/0268302 A1* | 9/2016 | Lee .................. H01L 27/11565 |
| 2017/0054036 A1 | 2/2017 | Dorhout et al. |
| 2017/0236896 A1 | 8/2017 | Lu et al. |
| 2017/0243650 A1 | 8/2017 | Ogawa et al. |
| 2017/0278859 A1* | 9/2017 | Sharangpani ..... H01L 27/11582 |
| 2017/0309339 A1 | 10/2017 | Hsiung et al. |
| 2018/0114794 A1 | 4/2018 | Jang et al. |
| 2018/0204849 A1 | 7/2018 | Carlson et al. |
| 2018/0254285 A1 | 9/2018 | Lee et al. |
| 2018/0294273 A1 | 10/2018 | Liao et al. |
| 2018/0323213 A1 | 11/2018 | Arai |
| 2019/0096905 A1 | 3/2019 | Park et al. |
| 2020/0125112 A1* | 4/2020 | Mao .................. G06K 9/00805 |

FOREIGN PATENT DOCUMENTS

| | | |
|---|---|---|
| KR | 10-2016-0094186 | 8/2016 |
| KR | 10-2017-0093099 | 8/2017 |
| KR | 10-2018-0045975 | 5/2018 |
| TW | 201901933 | 1/2019 |
| WO | WO 2016/093947 | 6/2016 |

OTHER PUBLICATIONS

U.S. Appl. No. 16/194,946, filed Nov. 19, 2018, by Clampitt et al.
U.S. Appl. No. 16/251,241, filed Jan. 18, 2019, by Howder et al.
U.S. Appl. No. 16/277,311, filed Feb. 15, 2019, by Bhushan et al.
U.S. Appl. No. 15/930,222, filed May 12, 2020, by Hopkins.
U.S. Appl. No. 15/930,724, filed May 13, 2020, by Hopkins.
U.S. Appl. No. 15/930,836, filed May 13, 2020, by Hopkins et al.
U.S. Appl. No. 15/931,116, filed May 13, 2020, by Hopkins et al.
U.S. Appl. No. 15/931,299, filed May 13, 2020, by Hopkins et al.
U.S. Appl. No. 16/807,388, filed Mar. 3, 2020, by Hopkins.
U.S. Appl. No. 16/807,573, filed Mar. 3, 2020, by Hopkins et al.
U.S. Appl. No. 16/894,519, filed Jun. 5, 2020, by Hopkins et al.
Shie, "The Interface Investigation of High-K Material Al2O3 on Si Substrate", A Thesis Submitted to the Institute of Electronics, College of Electrical Engineering and Computer Science, National Chiao Tung University, 2004, Taiwan, 63 pgs.

\* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power, Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention also encompass a memory array (e.g., NAND architecture) independent of method of manufacture. First example method embodiments are described with reference to FIGS. 1-26 which may be considered as a "gate-last" or "replacement-gate" process, and starting with FIGS. 1-4.

Figure 1:
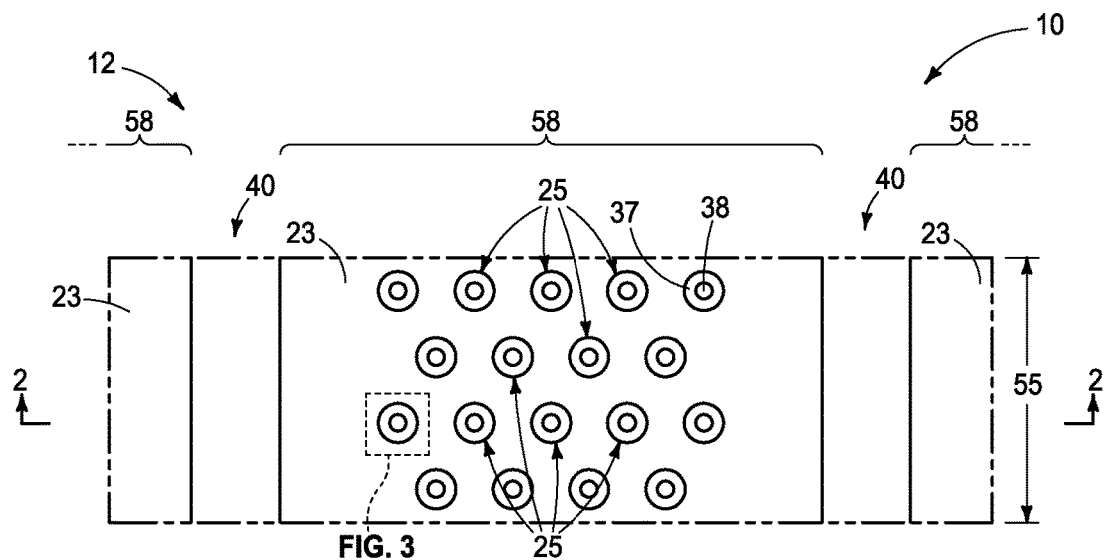
FIG. 1 is a diagrammatic cross-sectional view of a portion of a substrate in process in accordance with an embodiment of the invention and is taken through line 1-1 in FIG. 2.
Figure 2:
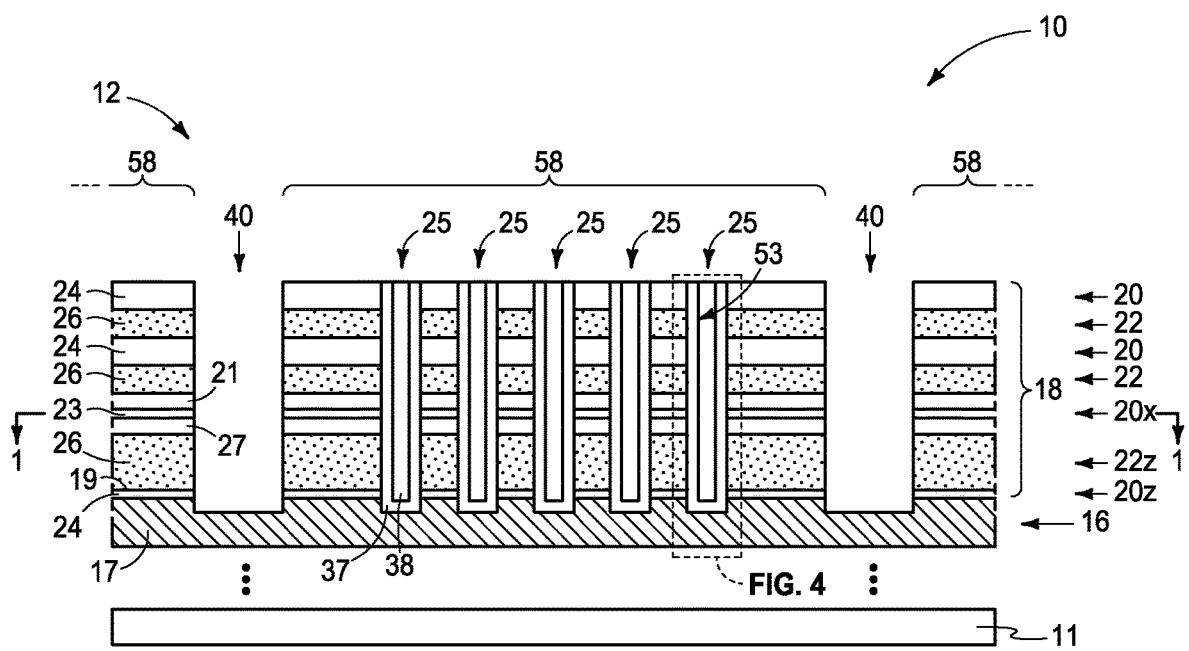
FIG. 2 is a diagrammatic cross-sectional view taken through line 2-2 in FIG. 1.
Figure 3:
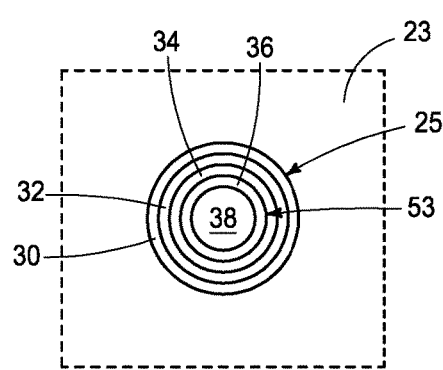
FIGS. 3-4 are enlarged views of portions of FIGS. 1 and 2.
Figure 4:
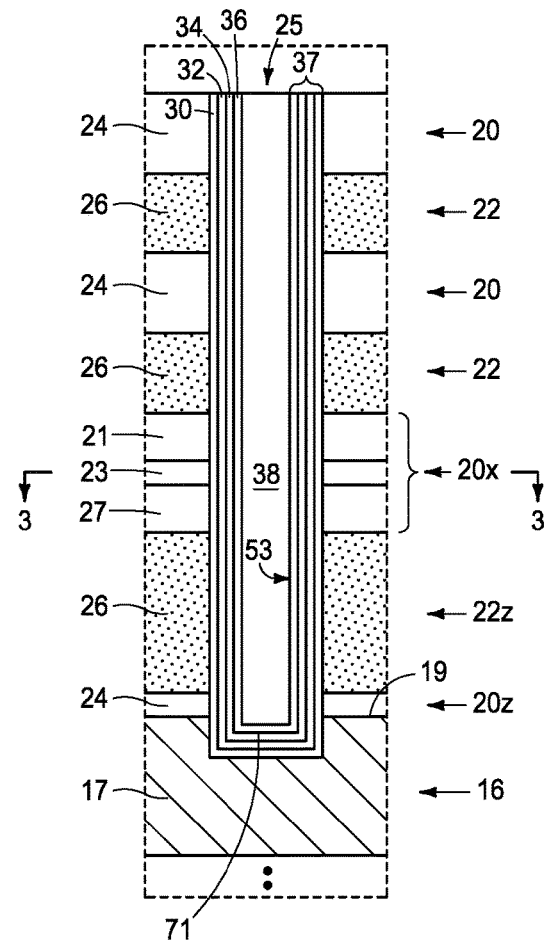

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11, Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., conductively-doped polysilicon atop $WSi_x$) has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20* and conductive tiers 22* has been formed above conductor tier 16 (an * being used as a suffix to be inclusive of all such same-numerically-designated components that may or may not have other suffixes). Example thickness for each of tiers 20* and 22* is 22 to 60 nanometers. Only a small number of tiers 20* and 22* is shown, with more likely stack 18 comprising dozens, a hundred or more, etc. of tiers 20* and 22*. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier. Regardless, conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". Example conductive tiers 22* comprise first material 26 (e.g., silicon nitride) which may be wholly or partially sacrificial. Example insulative tiers 20* comprise second material 24 (e.g., silicon dioxide) that is of different composition from that of first material 26 and which may be wholly or partially sacrificial.

In some embodiments, a lowest first tier 22z is thicker than the first tiers 22* there-above and in one such embodiment is at least 1.5 times thicker than first tiers 22* there-above. In one embodiment and as shown, lowest first tier 22z is not directly against conductor material 17 of conductor tier 16, for example where a lowest second tier 20z is vertically between conductor material 17 of the conductor tier 16 and lowest first tier 22z. Alternately, the lowest first tier may be directly against the conductor material of the conductor tier (not shown). In one embodiment, lowest second tier 20z is directly against a top 19 of conductor material 17 of conductor tier 16. In one embodiment, lowest second tier 20z is thinner than second tiers 20* there-above. In one embodiment, the second tier 20x that is immediately-above lowest first tier 22z (i.e., next-higher second tier 20x) is thicker than second tiers 20* there-above.

The second-tier material of second tier 20x that is immediately-above lowest first tier 22z (i.e., there being no other second tier vertically between lowest first tier 22z and said second tier 20x immediately-there-above) comprises an upper first insulative material 21 and a lower second material 23 under upper first insulative material 21, with lower second material 23 being of different composition from that of upper first insulative material 21. In one such embodiment, lower second material 23 is thinner than upper first insulative material 21. Regardless, upper insulative material 21 may be of the same composition as material 24. In some embodiments, the second-tier material of second tier 20x that is immediately-above lowest first tier 22z may be considered as comprising an upper insulative material 21, a lower material 27, and an intermediate material 23 vertically-between upper insulative material 21 and lower material 27, with intermediate material 23 being of different composition from that of lower material 27 and from that of upper insulative material 21 (lower material 27 being optional in some embodiments). In some such embodiments, upper insulative material 21 and lower material 27 are of the same thickness as one another. Regardless, in some embodiments upper insulative material 21 and lower material 27 are of the same composition relative one another (e.g., and the same composition as material 24) and in other embodiments are of different composition relative one another. In some embodiments, lower second material 23/intermediate material 23 comprises at least one of conductively-doped polysilicon, polysilicon that is not conductively doped, carbon-doped polysilicon, silicon nitride, undoped silicon nitride, carbon-doped silicon nitride, and metal material.

Channel openings 25 have been formed (e.g., by etching) through insulative tiers 20* and conductive tiers 22* to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to into conductor material 17 of conductor tier 16 is to provide and anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Horizontally-elongated trenches 40 have been formed (e.g., by anisotropic etching) into stack 18 to form laterally-spaced memory-block regions 58. Trenches 40 may have respective bottoms that are directly against conductor material 17 (atop or within) of conductor tier 16 (as shown) or may have respective bottoms that are elevationally-coincident with or below the bottom or conductor material 17 of conductor tier 16 (not shown). By way of example and for brevity only, channel openings 25 are shown as being arranged in groups or columns of staggered rows of four and five channel openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-4 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20* and conductive tiers 22*, thus comprising individual operative channel-material strings 53 in channel openings 25. Channel material 36 may be considered as having a lowest surface 71 thereof. Channel-material strings 53 in one embodiment have memory-cell materials (e.g., 30, 32, and 34) therealong and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 5:
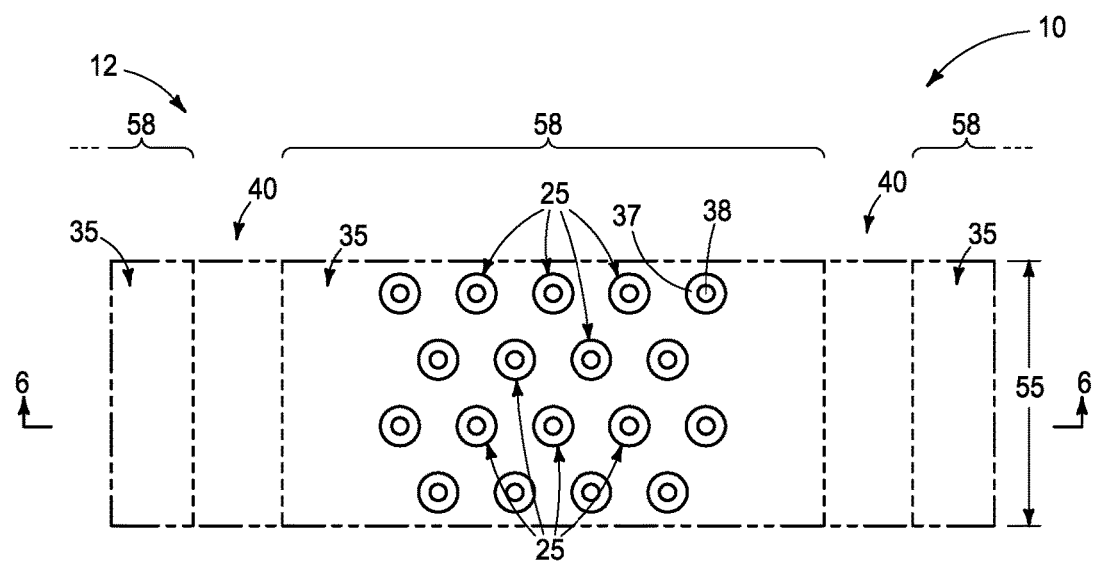
FIGS. 5-26 are diagrammatic sequential sectional, expanded, enlarged, and/or partial views of the construction of FIGS. 1-4, or portions thereof, in process in accordance with some embodiments of the invention.
Figure 6:
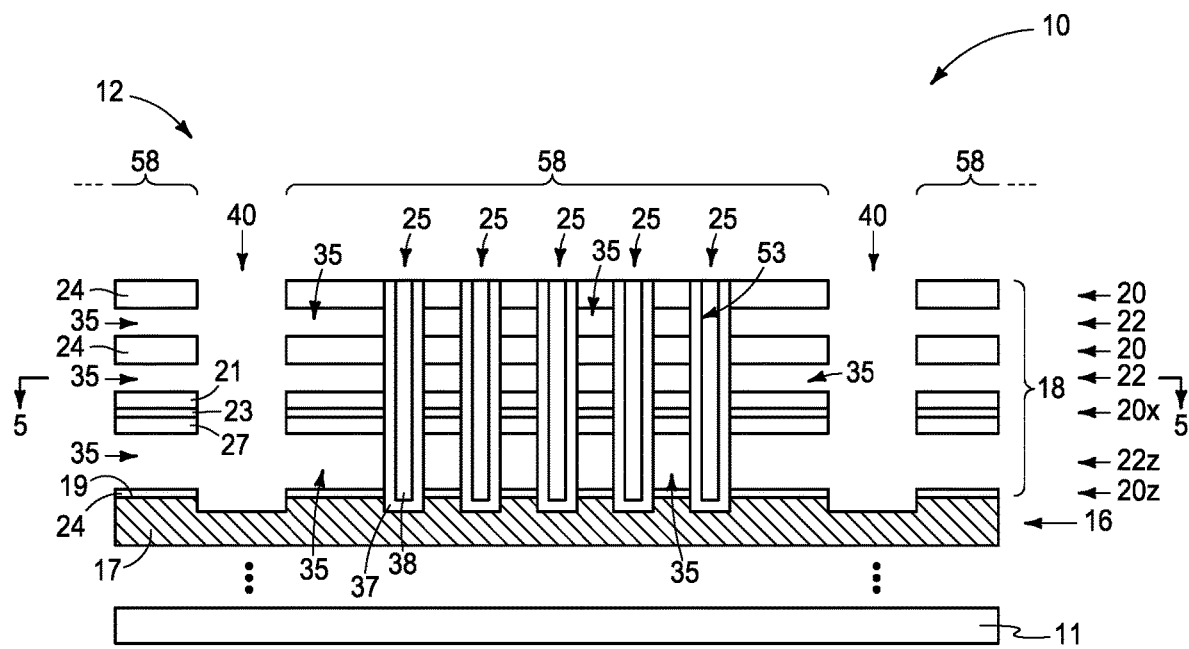

Referring to FIGS. 5 and 6, first-tier material 26 (not shown) has been isotropically etched selectively relative to second-tier material 24 (and in one embodiment as shown selectively relative to materials 17, 21, 23, and 27) to form void-space 35 in first tiers 22* (e.g., using liquid or vapor $H_3PO_4$ as a primary etchant where material 26 is silicon nitride and exposed other materials comprise one or more oxides or polysilicon). Some of lower second material 23/intermediate material 23 may be laterally etched thereby (not shown).

Figure 7:
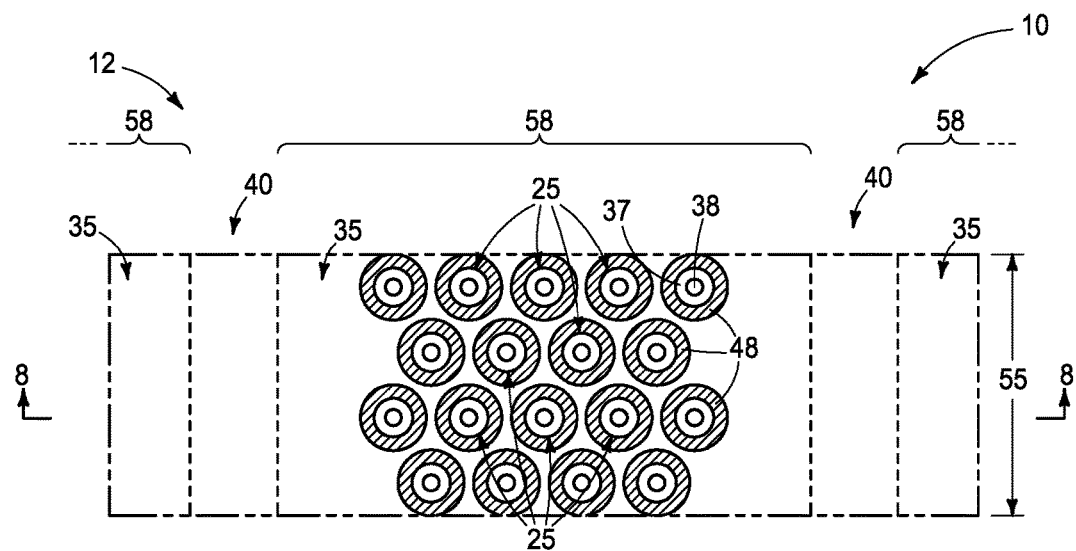
Figure 8:
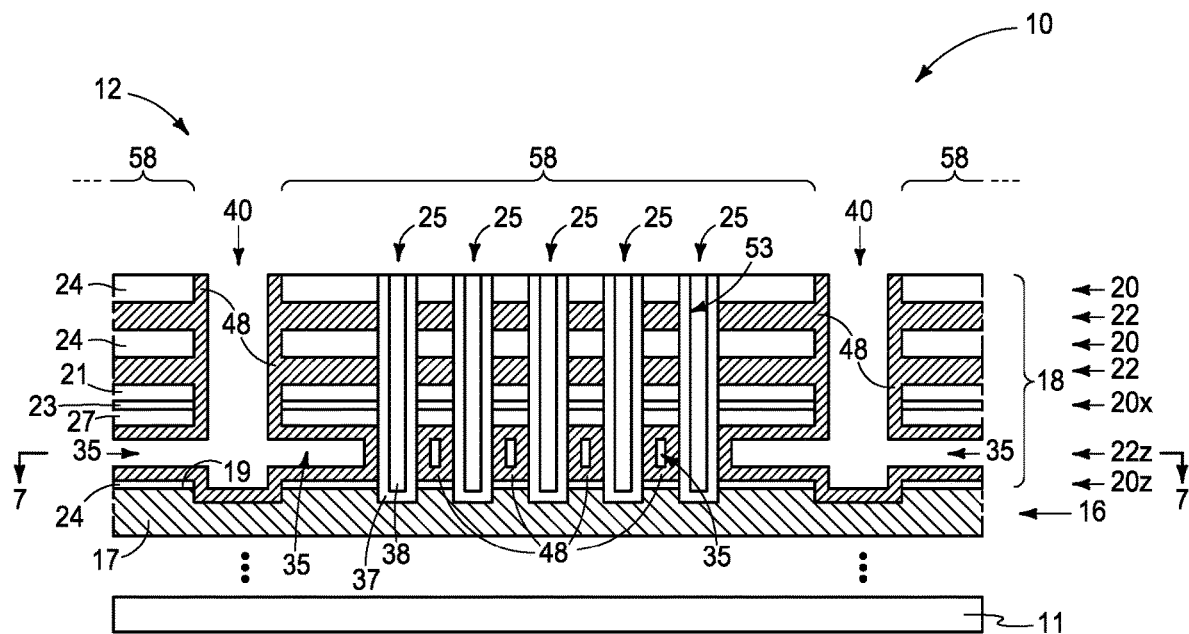

Referring to FIGS. 7 and 8, conducting material 48 has been deposited into trenches 40 and into void-space 35 in first tiers 22*. Conducting material 48 fills void-space 35 in first tiers 22* that are above lowest first tier 22z and less-than-fills void-space 35 in lowest first tier 22z.

Figure 9:
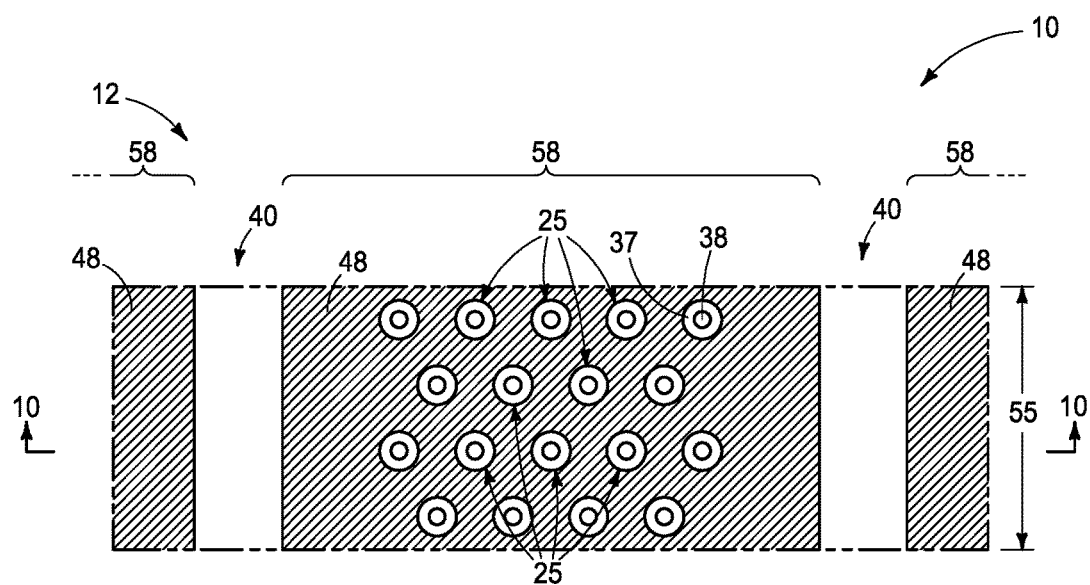
Figure 10:
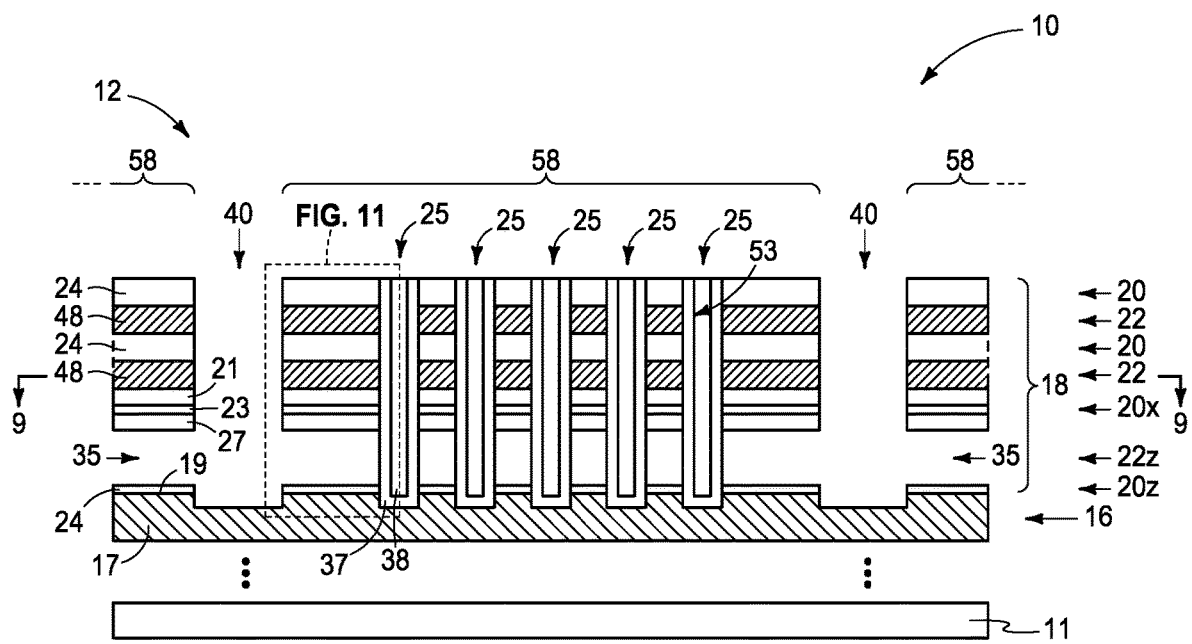
Figure 11:
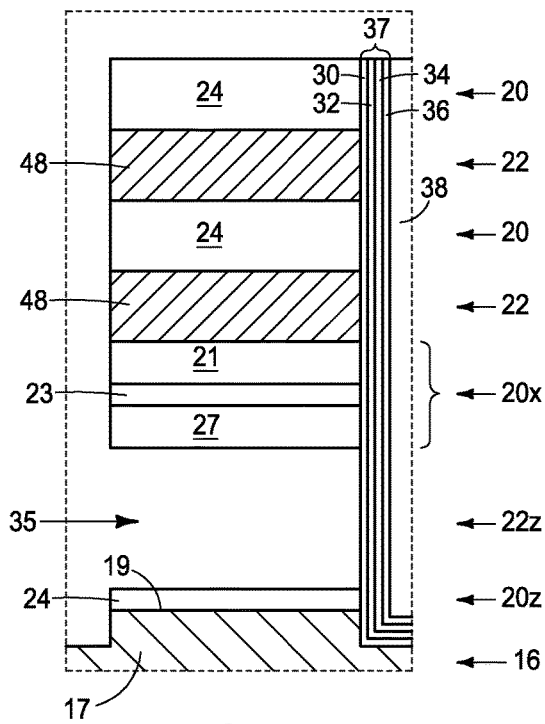
Figure 12:
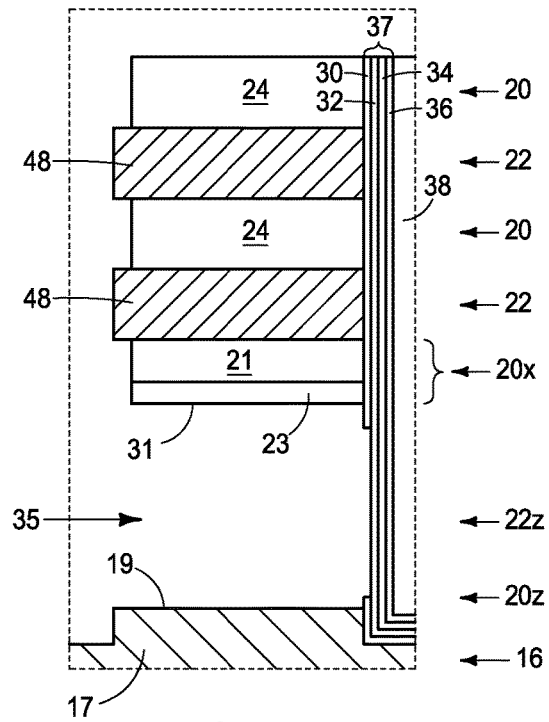
Figure 13:
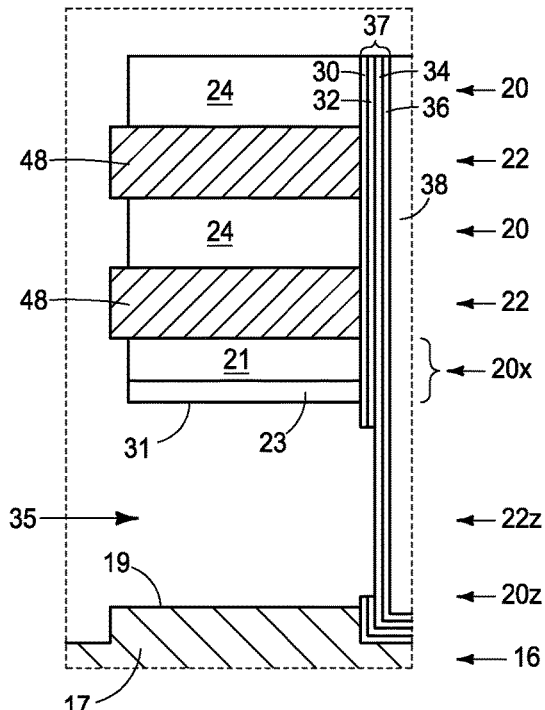

Referring to FIGS. 9-11, conducting material 48 has been etched (e.g., isotropically) from lowest first tier 22z. Such may be conducted selectively relative to at least an uppermost portion of conductor material 17 of conductor tier 16 and relative to materials 21, 23, and 27 as shown. Further, such etching may remove all remaining conducting material 48 that was in trenches 40 from previous processing (as shown). Further, some lateral recessing of material 48 and/or 23 may occur (not shown) relative to sidewalls of trenches 40 as defined by material 24. In one embodiment where lower material 27 is present, and as shown, the etching of conducting material 48 from lowest first tier 22z is conducted selectively relative to lower material 27 in next-higher second tier 20x to leave lower material 27 under intermediate material 23 in next-higher second tier 20x that is immediately-above lowest first tier 22z. The artisan is capable of selecting a suitable isotropic etching chemistry that will etch conducting material 48 selectively relative to material 24. As an example, a W conducting material 48 can be isotropically etched selectively relative to a $SiO_2$ material 24 and a polysilicon material 23 using a mixture of ammonia and hydrogen peroxide or a mixture of sulfuric acid and hydrogen peroxide.

Figure 14:
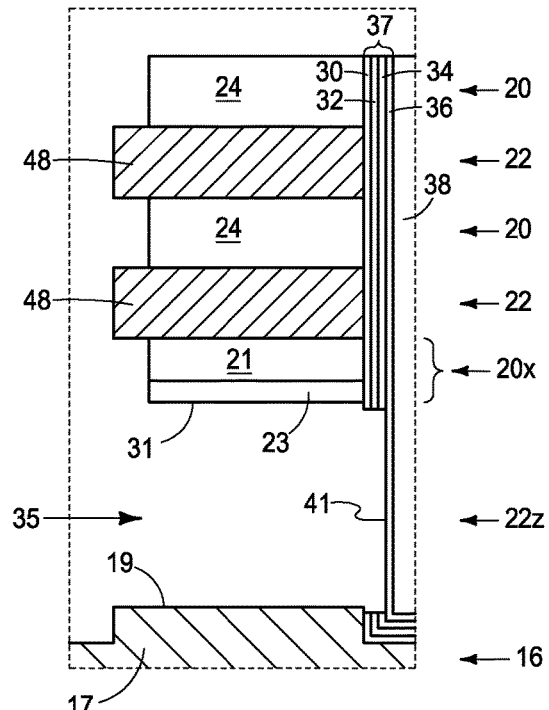
Figure 15:
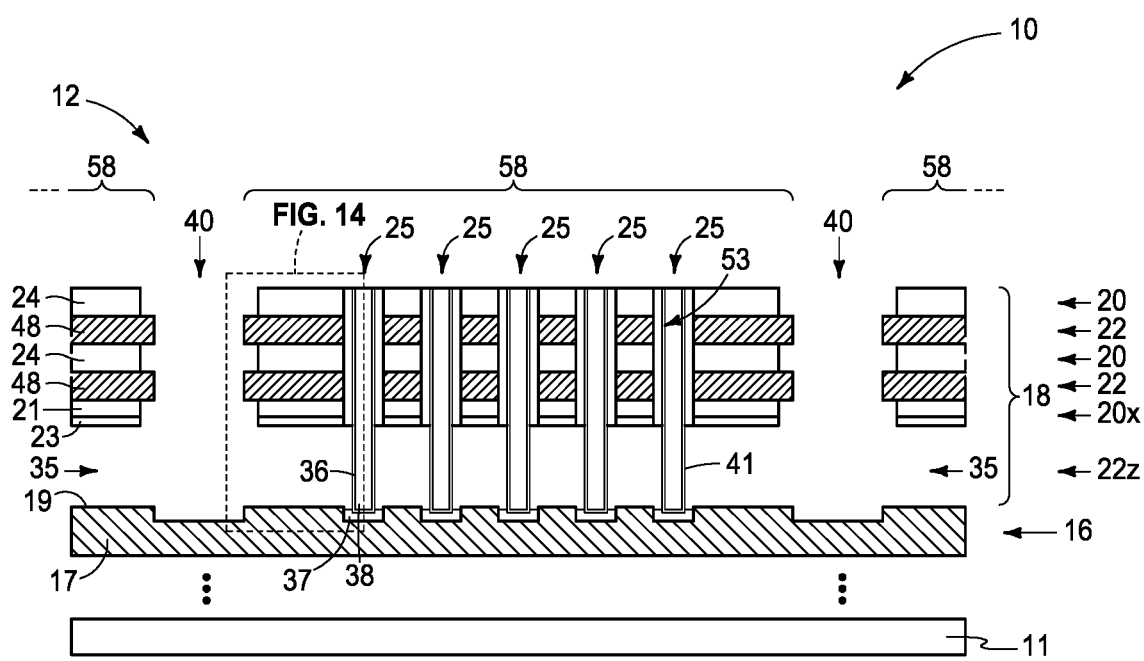

FIGS. 12-15 show subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched to expose a sidewall 41 of channel material 36 of channel-material strings 53. Regardless, and in one embodiment where lower material 27 is present and as shown in FIG. 11, lower material 27 (not shown in FIGS. 12-14) in second tier 20x that is immediately-above lowest first tier 22z has been etched selectively relative to and to expose a lower surface 31 of intermediate material 23. As an example, consider an embodiment where material 23 is polysilicon, materials 21, 24, and 27 are silicon dioxide, and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 14 and 15. The artisan is capable of selecting other chemistries for etching other different materials where a construction as shown in FIGS. 14 and 15 is desired. Lower material 27 (not shown) is shown as having been removed in the processing of FIG. 12 although such may not be removed until later in some embodiments.

Figure 16:
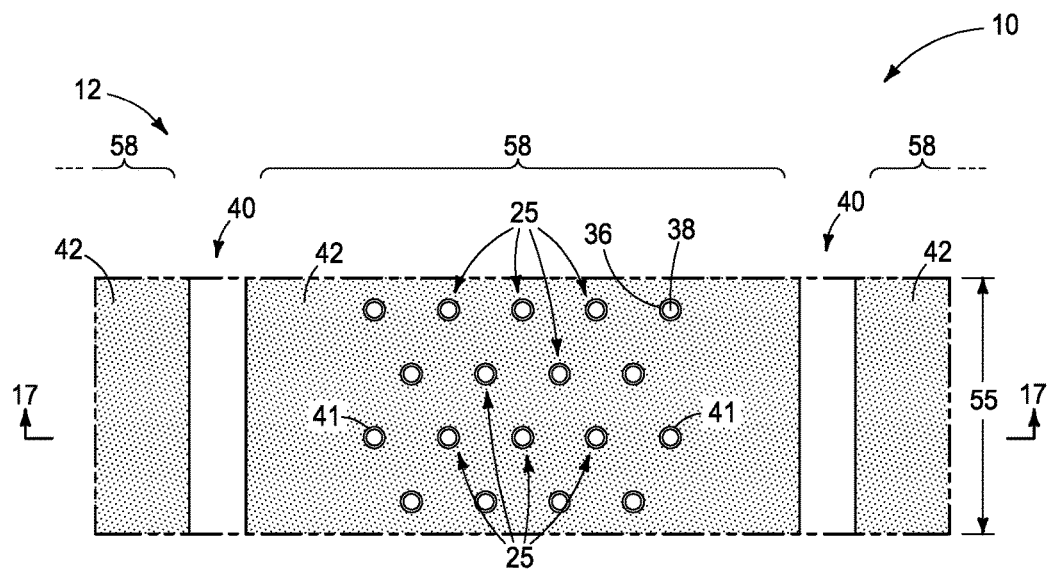
Figure 17:
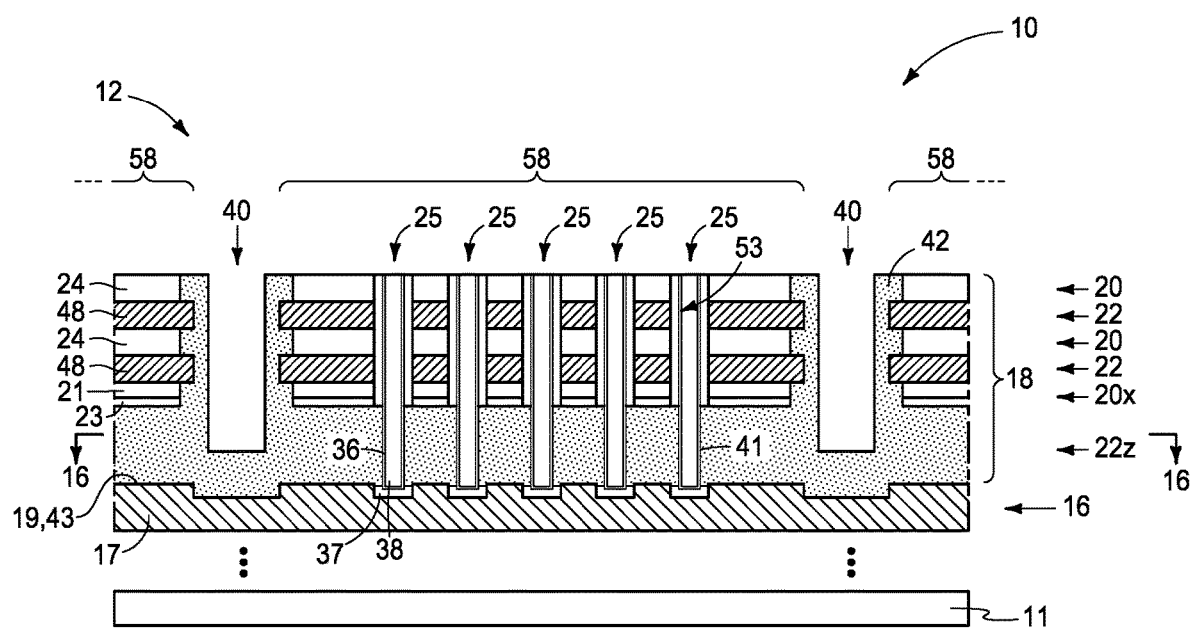

Referring to FIGS. 16 and 17, and in one embodiment, conductive/conducting material 42 has been deposited into void-space 35 of lowest first tier 22z under (and in one embodiment directly against) lower second material 23/intermediate material 23 in next-higher second tier 20x and directly against exposed sidewall 41 of channel material 36 of channel-material strings 53 and directly against an uppermost surface 43 of conductor material 17 of conductor tier 16. Uppermost surface 43 may be the same as top 19, for example if none of conductor material 17 has been subsequently etched. Such is but one example whereby conductive material 42 has been deposited to directly electrically couple together channel material 36 of individual channel-material strings 53 and conductor material 17 of conductor tier 16 (e.g., through channel-material sidewall 41). In one embodiment, at least an uppermost portion of conductor material 17 of conductor tier 16 is of the same composition as that of conductive material 42 (e.g., both being conductively-doped polysilicon). Alternately, conductive material 42 is of different composition from that of at least an uppermost portion of conductor material 17 of conductor tier 16.

Figure 18:
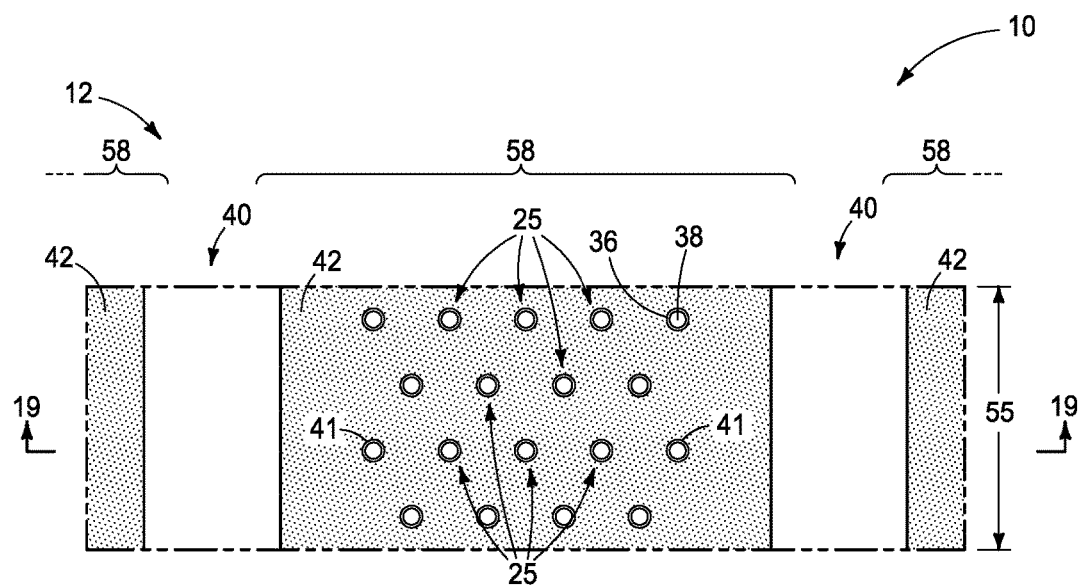
Figure 19:
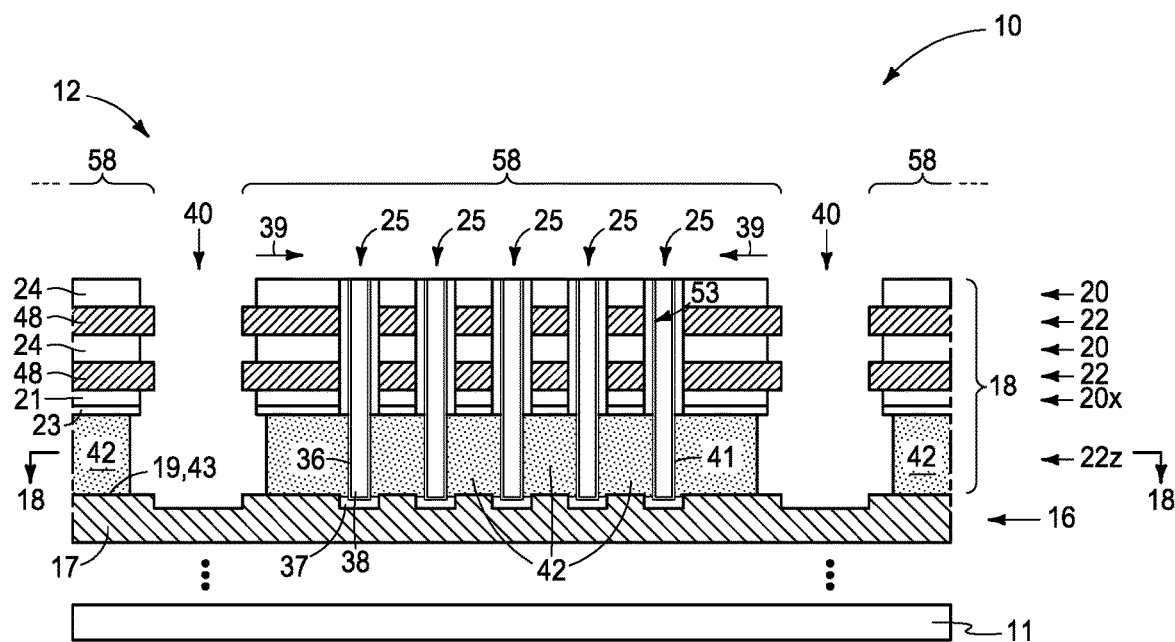
Figure 20:
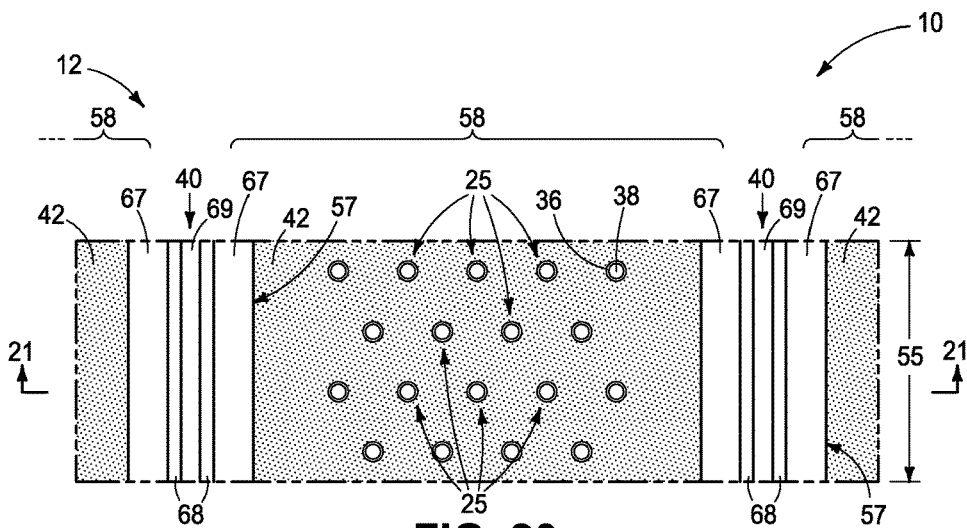
Figure 21:
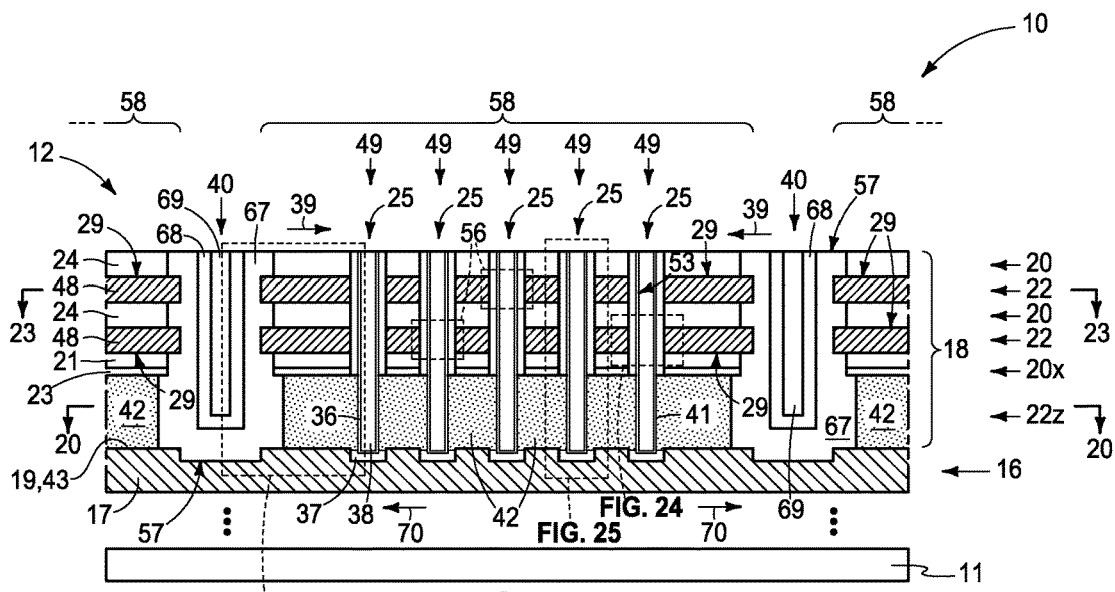
Figure 23:
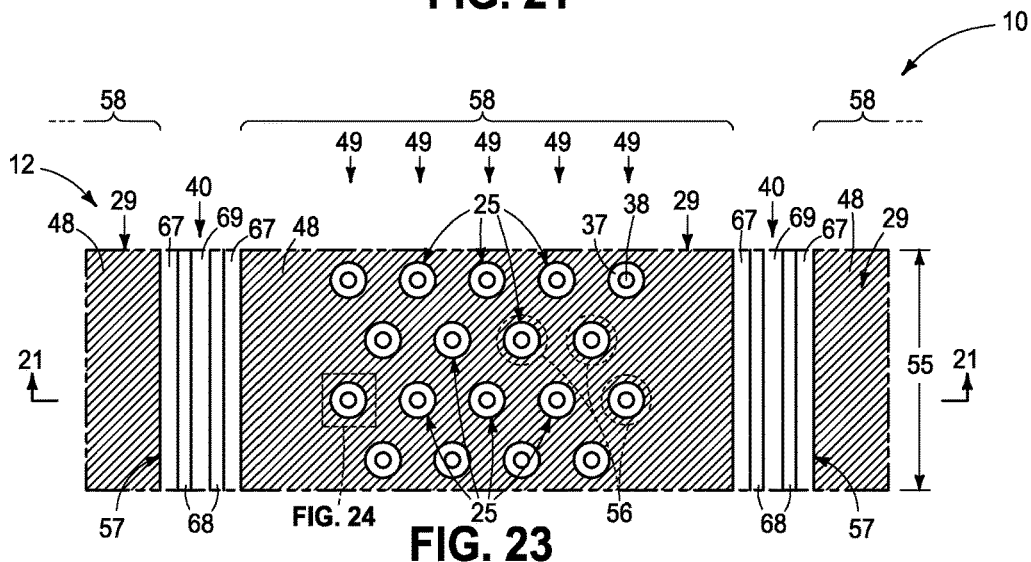
Figure 22:
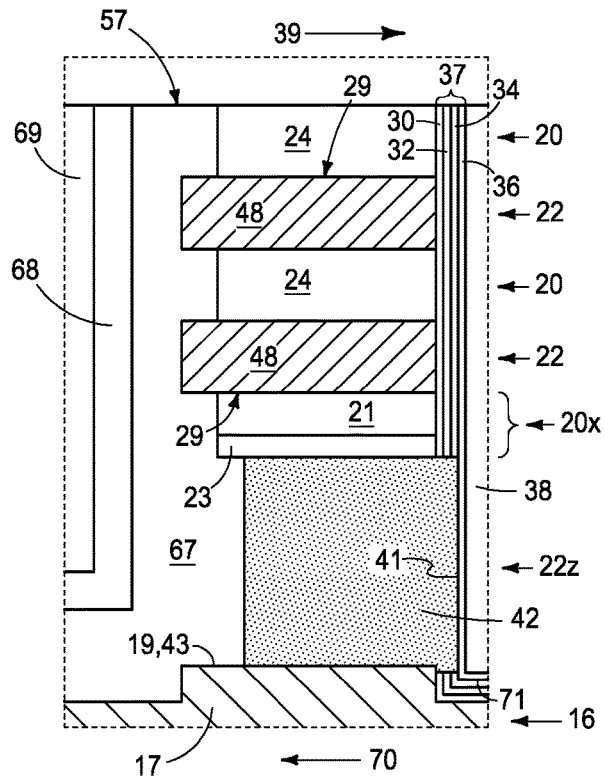
Figure 24:
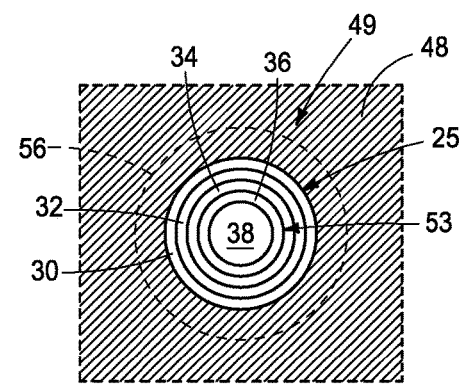
Figure 26:
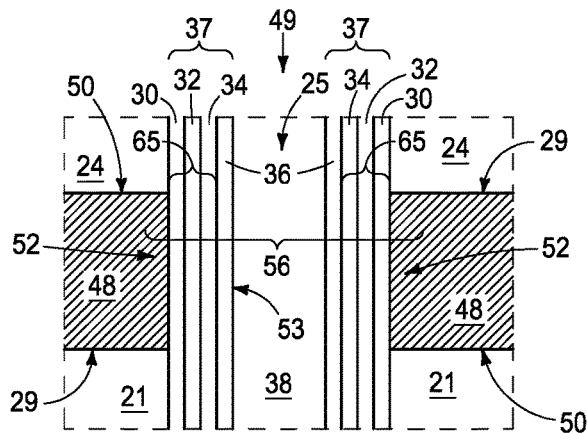
Figure 25:
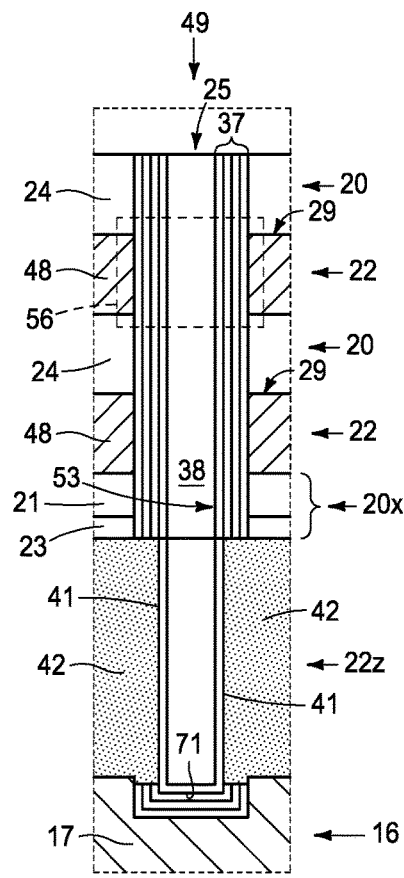

Referring to FIGS. 18 and 19, conductive material 42 has been removed from trenches 40, for example by timed isotropic etching that may be conducted selectively relative to materials 21, 23, 24, 48, and 17, Such may result in lateral recessing of conductive material 42 in direction 39 towards channel-material strings 53 as shown. Such may result in some etching of conductor material 17 when exposed (not shown). An example etching chemistry where material 42 is conductively-doped polysilicon, materials 21 and 24 are silicon dioxide, material 23 is silicon nitride, and material 48 is W is tetramethyl ammonium hydroxide. If material 23 is of the same composition as conductive material 24, material 23 may also be laterally etched thereby (not shown).

Referring to FIGS. 20-26, intervening material 57 has been formed laterally-between and longitudinally-along immediately-laterally-adjacent memory blocks 58. Intervening material 57 may provide lateral electrical isolation (insulation) between immediately-laterally-adjacent memory-blocks. Such may include one or more of insulative, semiconductive, and conducting materials and, regardless, may facilitate conductive tiers 22* from shorting relative one another in a finished circuitry construction. Example insulative materials are one or more of $SiO_2$, $Si_3N_4$, $Al_2O_3$, and undoped polysilicon. Intervening material 57 may include through array vias (TAV's) and not shown. By way of example only, intervening material 57 is shown as comprising a composite of insulating material 67 (e.g., silicon nitride), insulating material 68 (e.g., silicon dioxide), and insulative material 69 (e.g., undoped polysilicon). In one embodiment and as shown, intervening material 57 comprises insulating material (e.g., 67) that is directly against conductor material 17 of conductor tier 16 and in one embodiment insulating material (e.g., 67) of intervening material 57 projects laterally in direction 39 towards channel-material strings 53 to be directly under now-lowest second tier 20x in what ultimately will be a finished circuitry construction. Further and regardless, in one embodiment and as shown, conducting material 48 of first tiers 22* that are above lowest first tier 22z projects laterally in a direction 70 away from channel-material strings 53 into insulating material (e.g., 67) of intervening material 57 in the finished circuitry construction.

In one embodiment and as shown, lowest surface 71 (FIGS. 22 and 25) of channel material 36 of channel-material strings 53 is never directly against any of conductor material 17 of conductor tier 16.

Conducting material 48 forms individual conductive lines 29 (e.g., wordlines) and elevationally-extending strings 49 of individual transistors and/or memory cells 56. Approximate locations of transistors and/or memory cells 56 are indicated with a bracket in FIG. 26 and some with dashed outlines in FIGS. 21, 23, 24, and 25, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 26) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. As alluded to above, lowest first tier 22z may be a select gate tier (e.g., no operative memory cells being formed therein).

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a vertical stack (e.g., 18) comprising alternating insulative tiers (e.g., 20*) and conductive tiers (e.g., 22*) directly above the conductor tier. Conducting material (e.g., 42) of a lowest conductive tier (e.g., 22z) is directly against the conductor material of the conductor tier. In one such embodiment, the lowest of the conductive tiers is thicker than the conductive tiers thereabove. Channel-material strings (e.g., 53) of memory cells (e.g., 56) extend through the insulative tier and the conductive tiers. Intervening material (e.g., 57) is laterally-between and longitudinally-along immediately-laterally-adjacent of the memory blocks. The conducting material in the lowest conductive tier is directly against the channel material (e.g., 36) of individual of the channel-material strings. The insulative tier (e.g., 20x) immediately-above the lowest conductive tier comprises an upper first insulative material (e.g., 21) and a lower second insulative material (e.g., 23) under the upper first insulative material, with the lower second insulative material being of different composition from that of the upper first insulative material. In one such embodiment, the upper first insulative material comprises silicon dioxide and the lower second insulative material comprises undoped polysilicon. In one such embodiment, the upper first insulative material comprises silicon dioxide and the lower second insulative material comprises silicon nitride. In one such embodiment, the lower second insulative material is thinner than the upper first insulative material. In one such embodiment, the lowest of the conductive tiers is thicker than the conductive tiers there-above. In one such embodiment, the intervening material comprises insulating material that is directly against the conductor material of the conductor tier. In one such embodiment, the conductive material is directly against a sidewall (e.g., 41) of the channel material of the individual channel-material strings. Any other attribute(s) or aspect(s) as shown and/or described herein with respect to other embodiments may be used.

Figure 27:
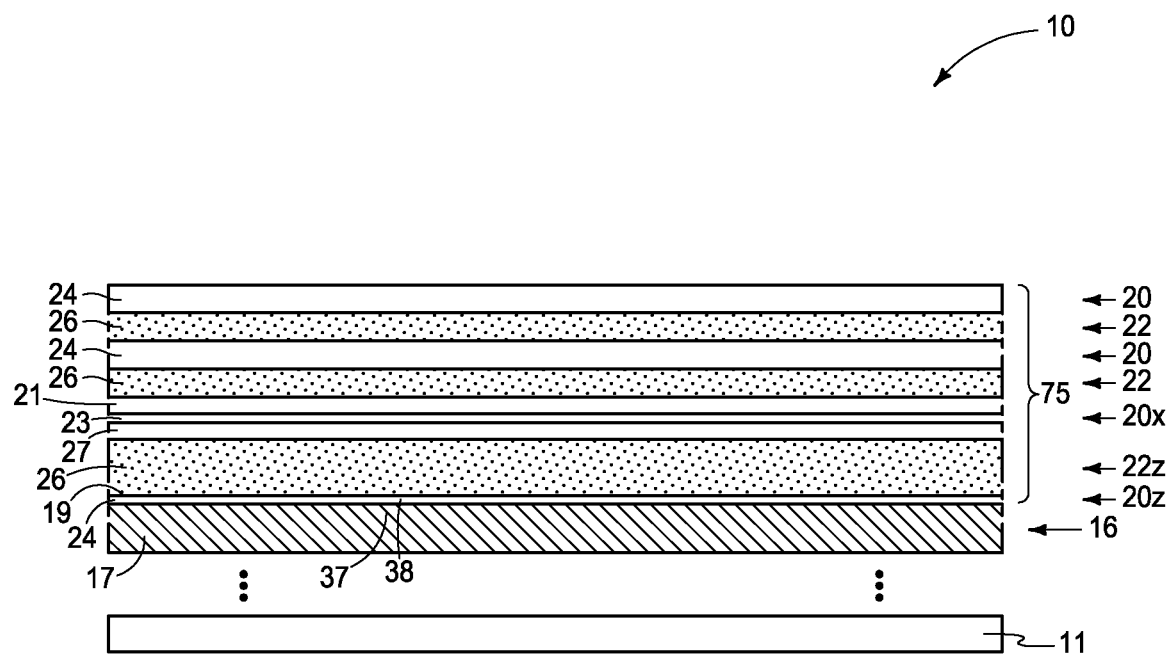
FIG. 27 is a diagrammatic cross-sectional view of another portion of the FIGS. 2 and 21 substrates.

In one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a vertical stack (e.g., 18) comprising alternating insulative tiers (e.g., 20*) and conductive tiers (e.g., 22*) directly above the conductor tier. Conducting material (e.g., 42) of a lowest conductive tier (e.g., 22z) is directly against the conductor material of the conductor tier. In one such embodiment, the lowest of the conductive tiers is thicker than the conductive tiers thereabove. Channel-material strings (e.g., 53) of memory cells (e.g., 56) extend through the insulative tier and the conductive tiers. Intervening material (e.g., 57) is laterally-between and longitudinally-along immediately-laterally-adjacent of the memory blocks. The conducting material in the lowest conductive tier is directly against the channel material (e.g., 36) of individual of the channel-material strings. Conductive material (e.g., 23) of different composition from that of the conducting material is above and directly against the conducting material. In one such embodiment, the conducting material comprises conductively-doped polysilicon and the conductive material comprises metal material. Any other attribute(s) or aspect(s) as shown and/or described herein with respect to other embodiments may be used.

Where materials 23 and 42 are of the same composition in the finished construction, such may not be discernible relative one another (e.g., an interface there-between may not be discernible). Regardless, in one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a first vertical stack (e.g., 18) comprising alternating insulative tiers (e.g., 20*) and conductive tiers (e.g., 22*) directly above the conductor tier. Conducting material (e.g., 42) of a lowest conductive tier (e.g., 22z) is directly against the conductor material of the conductor tier. Channel-material strings (e.g., 53) of memory cells (e.g., 56) extend through the insulative tier and the conductive tiers. Intervening material (e.g., 57) is laterally-between and longitudinally-along immediately-laterally-adjacent of the memory blocks. The conducting material in the lowest conductive tier is directly against the channel material (e.g., 36) of individual of the channel-material strings. A second vertical stack is positioned laterally of the first vertical stack. For example, consider FIG. 27 as comprising part of the construction exemplified by FIGS. 20-26 and additionally having a second vertical stack 75 positioned laterally of first vertical stack 18. Such second vertical stack comprises alternating first insulative tiers (e.g., 22*) and second insulative tiers (e.g., 20*), with a lowest of the first insulative tiers (e.g., 22z) being thicker than the first insulative tiers there-above. The first insulative tiers comprise first insulative material (e.g., 26) and the second insulative tiers comprising second insulative material (e.g., 21, 24, and/or 27) of different composition from that of the first insulative tiers. The second insulative tier (e.g., 22x) that is immediately-above the lowest first insulative tier comprises an upper insulative material (e.g., 21) and a lower material (e.g., 23) under the upper insulative material, with the lower material being of different composition from that of the upper insulative material. In one such embodiment, the second insulative tier that is immediately-above the lowest first insulative tier comprises a lowest insulative material under the lower material. For example, and by way of example only, such a construction 10 of FIG. 27 (in combination with that of FIGS. 2 and 20-26) may result in area where trenches 40 are not formed, whereby material 26 is not there-removed. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel acid/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A stack comprising vertically-alternating first tiers and second tiers is formed above the conductor tier. The stack comprises laterally-spaced memory-block regions having horizontally-elongated trenches there-between. Channel-material strings extend through the first tiers and the second tiers. Material of the first tiers is of different composition from that of the second tiers. A lowest of the first tiers is thicker than the first tiers there-above. The second-tier material of the second tier that is immediately-above the lowest first tier comprises an upper first insulative material and a lower second material under the upper first insulative material. The lower second material is of different composition from that of the upper first insulative material. The first-tier material is isotropically etched selectively relative to the second-tier material to form void-space in the first tiers. Conducting material is deposited into the trenches and into the void-space in the first tiers. The conducting material fills the void-space in the first tiers that are above the lowest first tier. The conducting material less-than-fills the void-space in the lowest first tier. The conducting material is etched from the lowest first tier. After the conducting material is etched, conductive material is deposited into the void-space of the lowest first tier under the lower second material in the second tier that is immediately-above the lowest first tier. The conductive material directly electrically couples together the channel material of individual of the channel-material strings and the conductor material of the conductor tier.

In some embodiments, a method used in forming a memory array comprising strings of memory cells comprises forming a conductor tier comprising conductor material on a substrate. A stack comprising vertically-alternating first tiers and second tiers is formed above the conductor tier. The stack comprises laterally-spaced memory-block regions having horizontally-elongated trenches there-between. Channel-material strings extend through the first tiers and the second tiers. Material of the first tiers is of different composition from that of the second tiers. A lowest of the first tiers is thicker than the first tiers there-above. The second-tier material of the second tier that is immediately-above the lowest first tier comprises an upper insulative material, a lower material, and an intermediate material vertically-between the upper insulative material and the lower material. The intermediate material is of different composition from that of the lower material and from that of the upper insulative material. The first-tier material is isotropically etched selectively relative to the second-tier material to form void-space in the first tiers. Conducting material is deposited into the trenches and into the void-space in the first tiers. The conducting material fills the void-space in the first tiers that are above the lowest first tier. The conducting material less-than-fills the void-space in the lowest first tier. The conducting material is etched from the lowest first tier selectively relative to the lower material in the second tier that is immediately-above the lowest first tier to leave the lower material under the intermediate material in the second tier that is immediately-above the lowest first tier. After the conducting material is etched, the lower material in the second tier that is immediately-above the lowest first tier is etched selectively relative to and to expose a lower surface of the intermediate material. After the etching of the lower material in the second tier that is immediately-above the lowest first tier, conductive material is deposited into the void-space of the lowest first tier under the intermediate material in the second tier that is immediately-above the lowest first tier. The conductive material directly electrically couples together the channel material of individual of the channel-material strings and the conductor material of the conductor tier.

In some embodiments, a memory array comprising strings of memory cells comprises a conductor tier comprising conductor material. The memory array comprises laterally-spaced memory blocks individually comprising a vertical stack comprising alternating insulative tiers and conductive tiers directly above the conductor tier. Conducting material of a lowest of the conductive tiers is directly against the conductor material of the conductor tier. Channel-material strings of memory cells extend through the insulative tiers and the conductive tiers. Intervening material is laterally-between and longitudinally-along immediately-laterally-adjacent of the memory blocks. The conducting material in the lowest conductive tier is directly against the channel material of individual of the channel-material strings. The insulative tier immediately-above the lowest conductive tier comprises an upper first insulative material and a lower second insulative material under the upper first insulative material. The lower second insulative material is of different composition from that of the upper first insulative material.

In some embodiments, a memory array comprising strings of memory cells comprises a conductor tier comprising conductor material. The memory array comprises laterally-spaced memory blocks individually comprising a vertical stack comprising alternating insulative tiers and conductive tiers directly above the conductor tier. Conducting material of a lowest of the conductive tiers is directly against the conductor material of the conductor tier. Channel-material strings of memory cells extend through the insulative tiers and the conductive tiers. Intervening material is laterally-between and longitudinally-along immediately-laterally-adjacent of the memory blocks. The conducting material in the lowest conductive tier is directly against the channel material of individual of the channel-material strings. Conductive material is of different composition from that of the conducting material above and directly against the conducting material.

In some embodiments, a memory array comprising strings of memory cells comprises a conductor tier comprising conductor material. The memory array comprises laterally-spaced memory blocks individually comprising a first vertical stack comprising alternating insulative tiers and conductive tiers directly above the conductor tier. Conducting material of a lowest of the conductive tiers is directly against the conductor material of the conductor tier. Channel-material strings of memory cells extend through the insulative tiers and the conductive tiers. Intervening material is laterally-between and longitudinally-along immediately-laterally-adjacent of the memory blocks. The conducting material in the lowest conductive tier is directly against the channel material of individual of the channel-material strings. A second vertical stack is laterally of the first vertical stack. The second vertical comprises alternating first insulative tiers and second insulative tiers. A lowest of the first insulative tiers is thicker than the first insulative tiers there-above. The first insulative tiers comprise first insulative material. The second insulative tiers comprise second insulative material of different composition from that of the first insulative tiers. The second insulative tier that is immediately-above the lowest first insulative tier comprises an upper insulative material and a lower material under the upper insulative material. The lower material is of different composition from that of the upper insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a conductor tier comprising conductor material on a substrate;
    forming a stack comprising vertically-alternating first tiers and second tiers above the conductor tier, the stack comprising laterally-spaced memory-block regions having horizontally-elongated trenches there-between, channel-material strings extending through the first tiers and the second tiers, material of the first tiers being of different composition from that of the second tiers, a lowest of the first tiers being thicker than the first tiers there-above, the second-tier material of the second tier that is immediately-above the lowest first tier comprising an upper first insulative material and a lower second material under the upper first insulative material, the lower second material being of different composition from that of the upper first insulative material;
    isotropically etching the first-tier material selectively relative to the second-tier material to form void-space in the first tiers;
    depositing conducting material into the trenches and into the void-space in the first tiers, the conducting material filling the void-space in the first tiers that are above the lowest first tier, the conducting material less-than-filling the void-space in the lowest first tier;
    etching the conducting material from the lowest first tier; and
    after the etching of the conducting material, depositing conductive material into the void-space of the lowest first tier under the lower second material in the second tier that is immediately-above the lowest first tier, the conductive material directly electrically coupling together the channel material of individual of the channel-material strings and the conductor material of the conductor tier.

2. The method of claim 1 comprising etching away all of the conducting material that is in the trenches before depositing the conductive material.

3. The method of claim 1 wherein at least an uppermost portion of the conductor material of the conductor tier is of the same composition as the conductive material.

4. The method of claim 1 wherein the lowest first tier is at least 1.5 times thicker than the first tiers there-above.

5. The method of claim 1 wherein the lowest first tier is not directly against the conductor material of the conductor tier during the isotropically etching.

6. The method of claim 5 wherein a lowest of the second tiers is vertically between the conductor material of the conductor tier and the lowest first tier during the isotropically etching.

7. The method of claim 6 wherein the lowest second tier is thinner than the second tiers there-above during the isotropically etching.

8. The method of claim 7 wherein the second tier that is immediately-above the lowest first tier is thicker than the second tiers there-above during the isotropically etching.

9. The method of claim 1 wherein the conductive material is of different composition from that of at least an uppermost portion of the conductor material of the conductor tier.

10. The method of claim 1 wherein a lowest surface of the channel material of the channel-material strings is never directly against any of the conductor material of the conductor tier.

11. The method of claim 1 wherein the conductive material in the void-space of the lowest first tier is directly against a sidewall of the channel material of the channel-material strings.

12. The method of claim 1 wherein the conductive material in the void-space of the lowest first tier is directly against an uppermost surface of the conductor material of the conductor tier.

13. The method of claim 1 wherein the lower second material comprises at least one of conductively-doped polysilicon, polysilicon that is not conductively doped, carbon-doped polysilicon, silicon nitride, undoped silicon nitride, carbon-doped silicon nitride, and metal material.

14. The method of claim 1 wherein the lower second material is thinner than the upper first insulative material.

15. The method of claim 1 wherein the conductive material is directly against the lower second material in the second tier that is immediately-above the lowest first tier.

16. A method used in forming a memory array comprising strings of memory cells, comprising:
    forming a conductor tier comprising conductor material on a substrate;
    forming a stack comprising vertically-alternating first tiers and second tiers above the conductor tier, the stack comprising laterally-spaced memory-block regions having horizontally-elongated trenches there-between, channel-material strings extending through the first tiers and the second tiers, material of the first tiers being of different composition from that of the second tiers, a lowest of the first tiers being thicker than the first tiers there-above; the second-tier material of the second tier that is immediately-above the lowest first tier comprising an upper insulative material, a lower material, and an intermediate material vertically-between the upper insulative material and the lower material; the intermediate material being of different composition from that of the lower material and from that of the upper insulative material;
    isotropically etching the first-tier material selectively relative to the second-tier material to form void-space in the first tiers;
    depositing conducting material into the trenches and into the void-space in the first tiers, the conducting material filling the void-space in the first tiers that are above the lowest first tier, the conducting material less-than-filling the void-space in the lowest first tier;
    etching the conducting material from the lowest first tier selectively relative to the lower material in the second tier that is immediately-above the lowest first tier to leave the lower material under the intermediate material in the second tier that is immediately-above the lowest first tier;
    after the etching of the conducting material, etching the lower material in the second tier that is immediately-above the lowest first tier selectively relative to and to expose a lower surface of the intermediate material; and after the etching of the lower material in the second tier that is immediately-above the lowest first tier, depositing conductive material into the void-space of the lowest first tier under the intermediate material in the second tier that is immediately-above the lowest first tier, the conductive material directly electrically coupling together the channel material of individual of the channel-material strings and the conductor material of the conductor tier.

17. The method of claim 16 wherein the intermediate material comprises at least one of conductively-doped polysilicon, polysilicon that is not conductively doped, carbon-doped polysilicon, silicon nitride, undoped silicon nitride, carbon-doped silicon nitride, and metal material.

18. The method of claim 16 wherein the intermediate material is thinner than the upper insulative material and the lower material.

19. The method of claim 16 wherein the conductive material is directly against the intermediate material in the second tier that is immediately-above the lowest first tier.

* * * * *